AUTOMATED BRICKLAYING DEVICE

Original Filed May 15, 1972 11 Sheets-Sheet 1

United States Patent Office

Re. 28,305
Reissued Jan. 21, 1975

28,305

AUTOMATED BRICKLAYING DEVICE

Ronald Eugene Williamson, Hammondsville, and Sidney Clark Porter, Jr., East Liverpool, Ohio, and Kenneth Frederic Shotting, Coraopolis, Pa., assignors to Combustion Engineering, Inc., Windsor, Conn.

Original No. 3,757,484, dated Sept. 11, 1973, Ser. No. 253,546, May 15, 1972. Application for reissue May 3, 1974, Ser. No. 466,566

Int. Cl. B65g *37/00;* E04g *21/22*

U.S. Cl. 52—749 34 Claims

Matter enclosed in heavy brackets [ ] appears in the original patent but forms no part of this reissue specification; matter printed in italics indicates the additions made by reissue.

ABSTRACT OF THE DISCLOSURE

An automated bricklaying device for laying out the refractory brick lining of a metal pouring ladle having an upright frame means mounted on a mounting means for traversing the interior circumference of the ladle. A platform means, which has a delivery means mounted theeon for reciprocal lateral movement, is carried by the upright frame means for substantially vertical movement within the ladle. The delivery means continuously delivers a series of refractory bricks in turn to the circumference of the ladle to be set as the lining thereof. A positioning and indexing means properly positions each brick in turn in the lining as it is delivered from the delivery means. The positioning and indexing means additionally serves to index the upright frame means to a proper position for placement of the next succeeding brick in the lining. A vertical guidance means on the delivery means provides vertical elevational control of the platform means relative to the built up lining.

BACKGROUND OF THE INVENTION

In the making of steel a ladle is required for receiving molten steel from the steel-making furnace, the ladle serving to transport the steel from the furnace to the area in which ingots or castings are made. These ladles must have some means to prevent the molten steel from penetrating to the outer metal sheath of the ladle and as such require a refractory lining. The refractory lining must exhibit the characteristics of being readily adaptable to conform to the shape of the ladle and the ability to withstand widely fluctuating temperatures and erosive action of the molten steel. Since the ladle is moved and tilted about its supporting axis, the lining must be so cohesive to remain in place during movement, yet be capable of being easily removed for repair or replacement.

Ladle linings are presently formed by building up individual refractory blocks in a close fitting pattern. The blocks generally used are curved convexly at one end and concavely at the other, with the chordal plane through the cylindrically curved ends of each form of block not having the same angular relation. By this construction a standard refractory block may be used to build a lining for ladles of varying sizes and varying shapes. This arrangement is shown in U.S. Pat. No. 3,140,333 to W. T. Tredennick.

In forming the ladle lining, the refractory blocks have been placed within the ladle by hand by unskilled laborers generally taking from 16–64 manhours per ladle. Even though the blocks are uniform so that little skill is involved, this use of manual labor adds considerably to the overall cost of steel manufacture. This expense is compounded by the fact that the ladle lining will only last through approximately 20 charges from the steel-making furnace before the lining must be replaced. This requires that the ladle be taken out of service for lining replacement after only several days' operation.

SUMMARY OF THE INVENTION

There is herein provided an apparatus for automating the laying of refractory bricks within a metal pouring ladle to serve as the working lining thereof, thereby reducing the time necessary for relining as well as the cost. A delivery means, for delivering a series of refractory bricks in turn to the circumference of the ladle to be set as the lining thereof, is supported inside the ladle by a support means. The support means permits of the delivery means longitudinal movement along, reciprocal lateral movement relative to, and revolutional movement about an axis thereof positioned within and substantially parallel to the axis of the ladle to be lined. A brick positioning means is associated with the delivery means and is provided for positioning and firmly setting each brick in turn in the lining as it is delivered to the circumference of the ladle. The delivery means and the brick positioning means are moved longitudinally along, laterally relative to and [revolutionary] *revolutionally* about the axis of the support means by an operating means so as to position the delivery means and brick positioning means relative to the circumference of the ladle. A control means controllably operates this operating means after a brick has been positioned in place in the lining so as to properly position the delivery means and brick positioning means for the placement of the next succeeding brick in the lining.

With such an apparatus, a ladle may be lined in 3–4 hours. Also, only one man is required to operate the bricklaying device.

Although this automated bricklaying device was developed for use in lining metal pouring ladles, it will be apparent from the description hereinbelow that the device is readily adaptable to reline any type of vessel in which relining is periodically required.

DESCRIPTION OF THE PREFERRED EMBODIMENT

Figure 1:
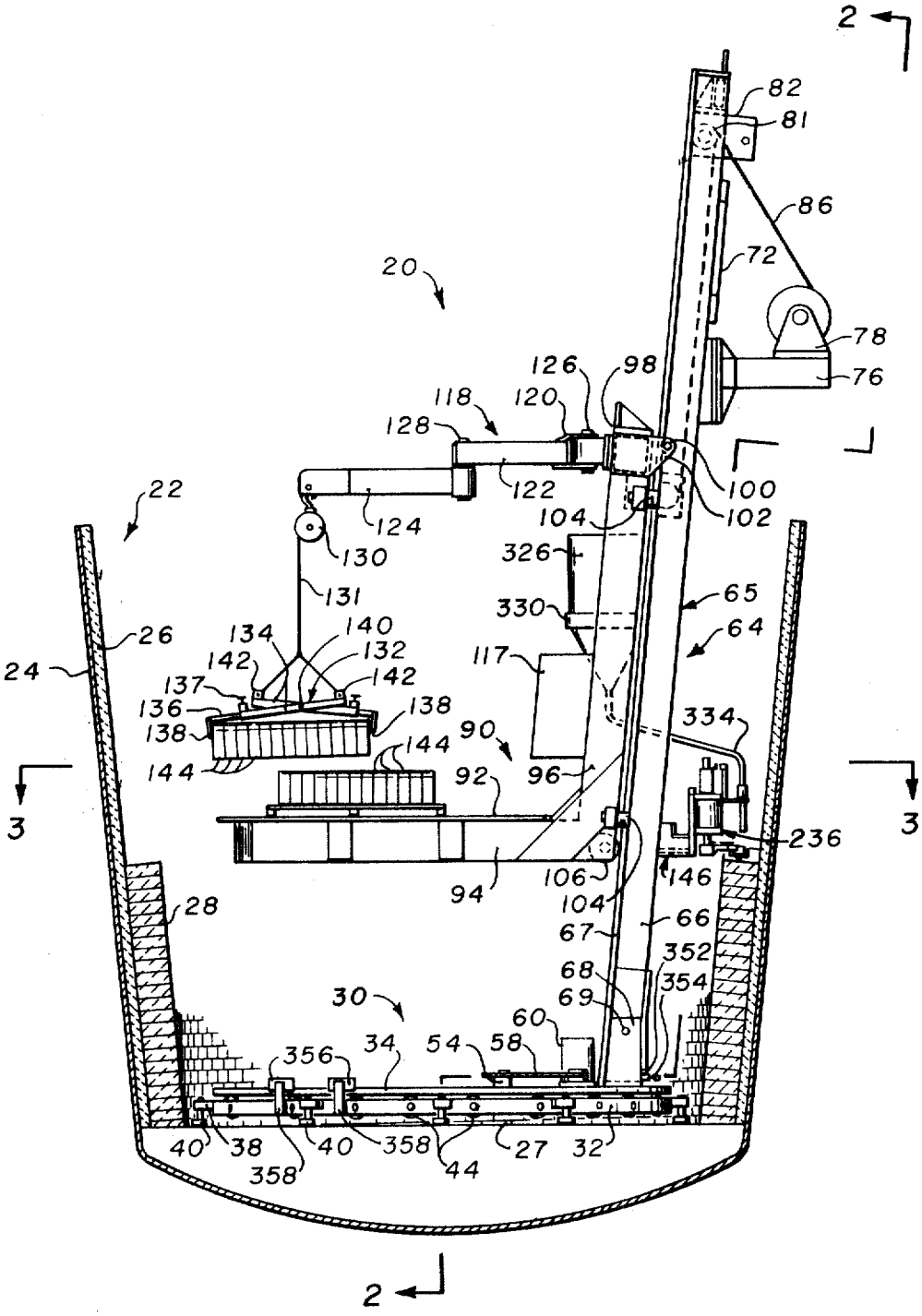
FIG. 1 is a side elevation view of the automated bricklaying device according to the present invention positioned within the ladle shell.
Figure 2:
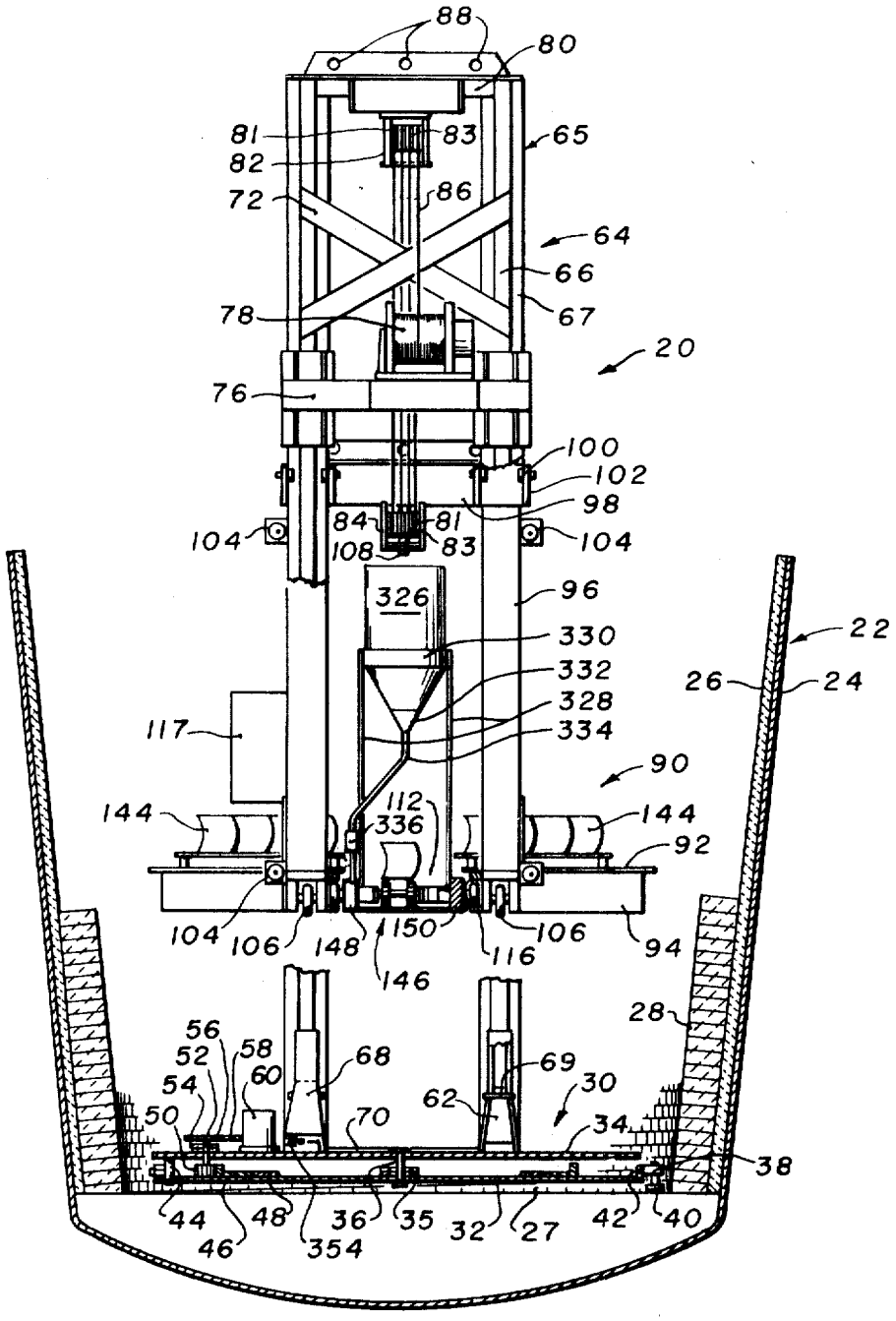
FIG. 2 is a front elevation view, partly in section, taken along line 2—2 of FIG. 1 with a portion thereof removed.

Referring to the drawings, FIGS. 1 and 2 show an automated bricklaying device 20 positioned within a metal pouring ladle 22. The ladle 22 is comprised of a steel shell 24 with a safety lining 26 forming the interior thereof. Within the safety lining 26 is a working lining 28 which is periodically damaged and eroded during the steelmaking process and needs to be replaced. It is the replacement of this working lining 28 to which the particular bricklaying device 20 of this invention is concerned.

The automated bricklaying machine is comprised of three separate assemblies such that it may be installed and removed from the ladle in three pieces or sections, or alternatively it may be installed or removed as a unit. These three assemblies are the support assembly 30, the elevator frame assembly 64, and the carriage assembly 90. The support assembly 30, as depicted in FIGS. 1 and 2, is a turntable mechanism comprised of a lower platen 32 supported on the floor of the ladle 22 by means of leveling screws 40 mounted in flanges 38 spaced about the periphery of the platen 32 and an upper platen 34 having a central downwardly extending shaft 36 journaled in bearing 35 on the lower platen 32. The upper platen 34 is supported from the lower platen 32 for rotation relative thereto about the shaft 36 by a plurality of rollers 44 intermittently spaced about and journaled in an upright ring 42 positioned at the periphery of the lower platen 32. An annular gear ring 46 having outwardly extending gear teeth is centrally located on the lower platen by an inner locating ring 48 for engaging a pinion gear 50 having a shaft 52 journaled in a bearing 54 of the upper platen 34. A sprocket 56 is rigidly fixed to the shaft 52 above the platen 34 and is connected to a rotary air motor 60 by a chain 58 for rotating the pinion gear 50 which in turn will rotate the upper platen 34 relative to the lower platen 32.

Figure 3:
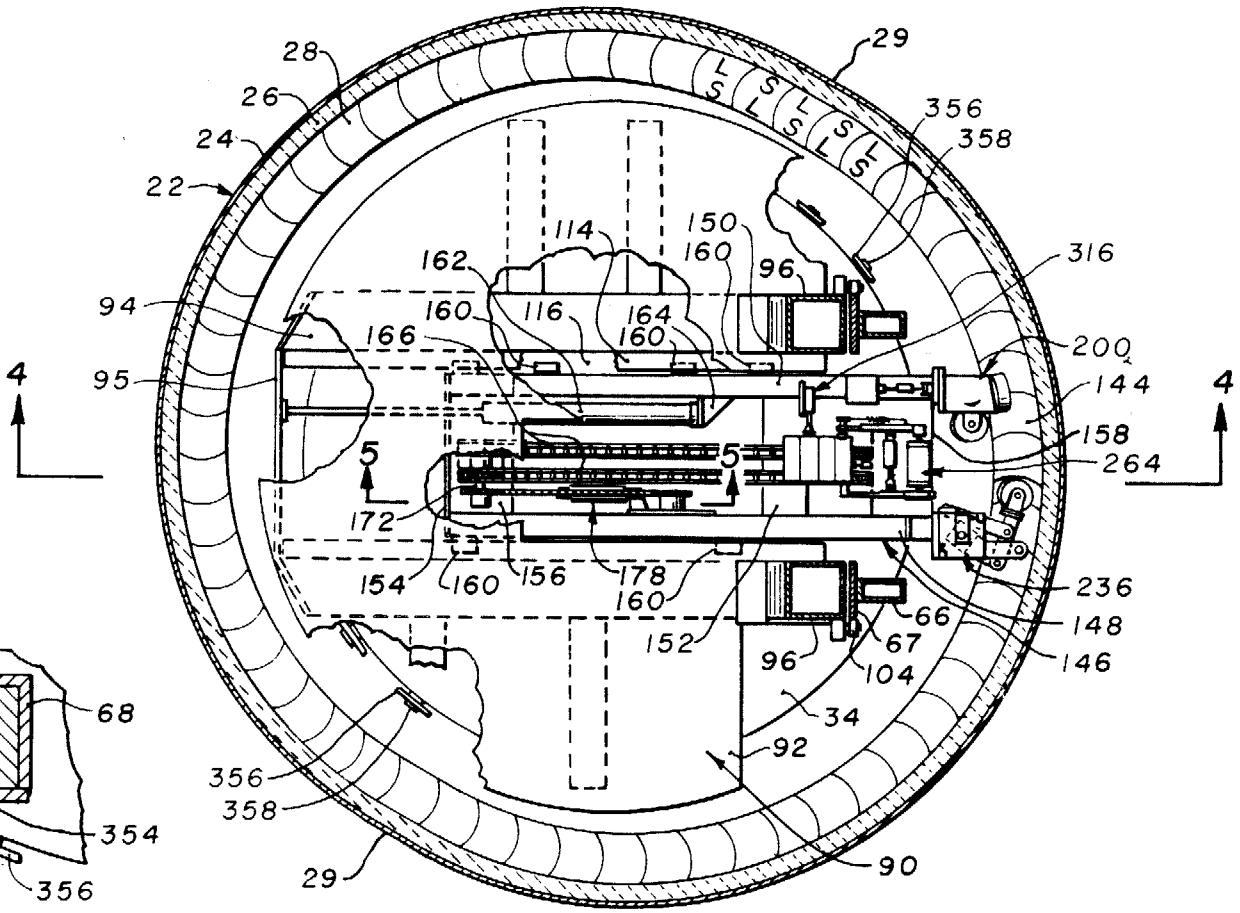
FIG. 3 is a top view of the automated bricklaying device taken along line 3—3 of FIG. 1.

The elevator frame assembly 64 is comprised of two spaced T-shaped standards 65 formed by joining together a rectangular beam 66 and a flat plate 67 as shown in FIGS. 1, 2 and 3. Each of the standards 65 has integrally attached thereto at its lower end a connecting couple 68 whose inner surface conforms identically to the outer surface of lugs 62 provided on the platen 34, the lugs 62 serving to support the elevator frame assembly at an angle conforming to the slope of the ladle wall 24. A pin 69 passes through the lugs 62 and the connecting bases 68 to hold the standards in place. Standards 65 are interconnected and held in spaced relation by a tie bar 70 at the bottom, an X-brace 72 near the top and a tie bar support 80 at the top, the support 80 having lifting holes 88 for introducing into or removing from the ladle 22, either the elevator frame assembly 64 or the entire bricklaying device 20. A hoist motor support 76 integrally attached to the standards 65 extends laterally outward from the elevator frame assembly and supports a rotary air actuated hoist motor 78 thereon. A cable 86 extending from the hoist motor 78 passes over sheaves 81 separated by sheave spacers 83 of the upper and lower hoist blocks 82 and 84, the upper hoist block 82 being supported from the tie bar support 80 and the lower hoist block 84 being supported by the cable 86. Actuation of the hoist air motor 78 will effectuate either a lowering or raising of the lower hoist block 84.

Figures 4, 5:
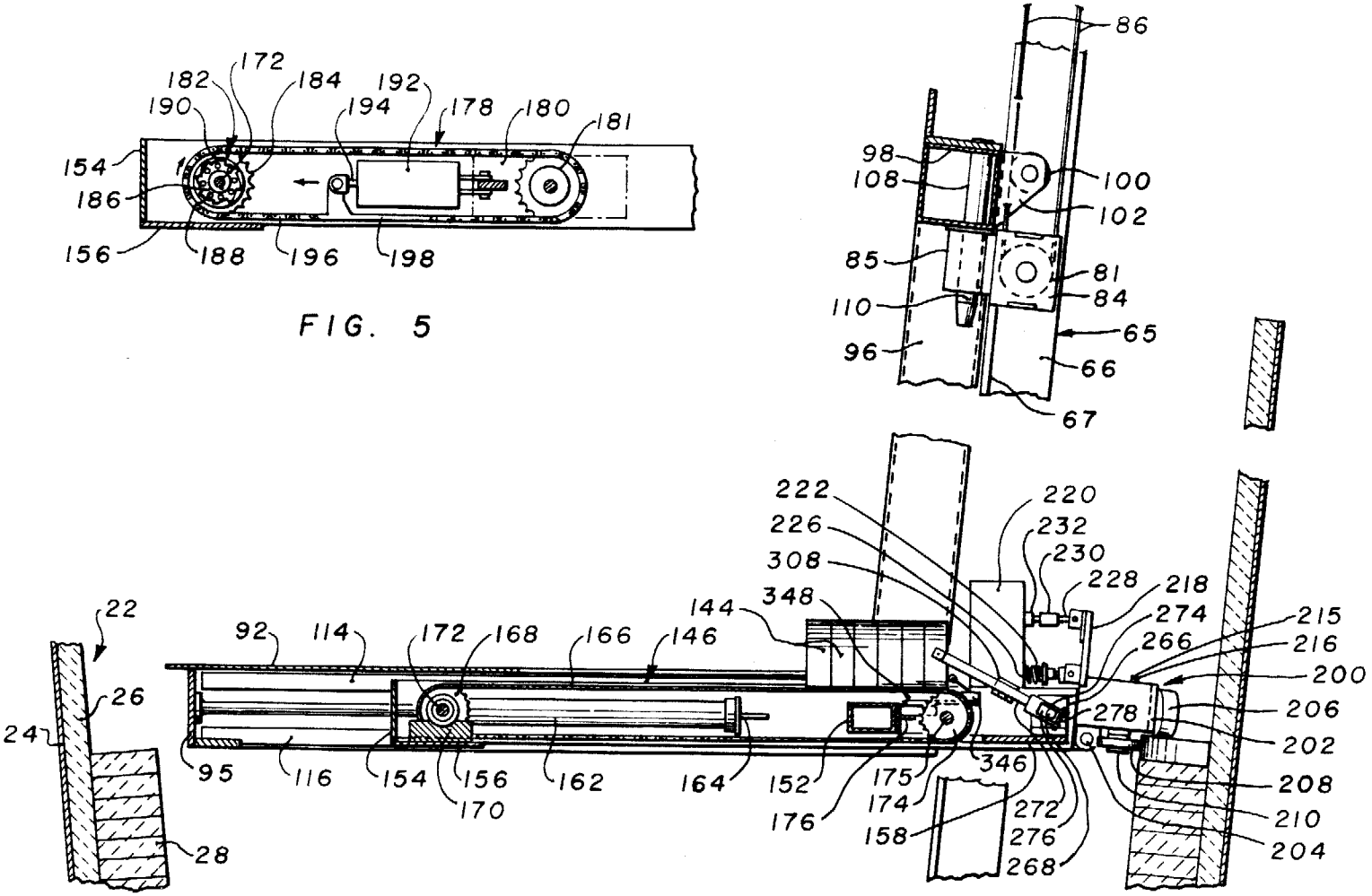
FIG. 4 is an elevation view, partly in section, taken along line 4—4 of FIG. 3.
FIG. 5 is a detailed section view of the conveyor indexing mechanism according to the present invention taken along line 5—5 of FIG. 3.

The carriage platform assembly 90 is carried by the elevator frame assembly 64 in such a manner so as to be vertically movable within the ladle 22. The carriage assembly 90 has horizontal base members 94 supporting a platform 92. Two carriage upright supports 96 extend upward from the base members 94 inclined relative to the plate at an angle substantially equal to the incline angle of the ladle and elevator frame assembly 64. The upper portion of the uprights 96 are interconnected by cross support 98 having integrally attached thereto a downwardly extending pin 108. As best seen in FIG. 4, the cross support 98 and thus the carriage assembly 90, is supported from the elevator frame assembly 64 by the lower hoist block extension [84] *85*, the pin 108 passing through a hole in the extension [84] *85* and being retained in place by a cotter pin 110 extending through a transverse hole in the pin 108. This manner of supporting the carriage assembly is advantageous in that the lower hoist block 84 remains coupled to the elevator frame assembly 64 upon removal of the carriage assembly 90 therefrom.

A plurality of rollers 100, 104 and 106 are rotatably mounted from the upright supports 96 so that the carriage platform assembly 90 will be guided in its vertical movement within the ladle 22 by the elevator frame assembly 64. The upper set of rollers 100 ride on the rear surface of the plate 67 of the elevator standard 65 and are journaled in plates 102 extending outward from the uprights 96 on either side of the standards 65 while the lower rollers 106 are journaled in the uprights 96 to ride along the front surface of the plate 67. The combination of these two sets of rollers 100, 106 provides the necessary stability to insure that the carriage assembly 90 remains in position as it is moved up and down the standards 65. Lateral stability is provided for the carriage assembly 90 by the rollers 104 which pass along the outside edges of the flat plate 67. There are two rollers 104 positioned at the upper portion of the uprights 96 and two positioned at the lower portion.

A boom mechanism 118 is supported from the cross support 98 for lifting bricks 144 from the pallets of bricks on the platform 92 and placing them on a delivery means or conveyor assembly 146 to be described hereinbelow. A support member 120 attached to the cross support member 98 carries pivot pin 126 to which is mounted for pivotal movement in a horizontal plane a first beam 122. A second beam 124 is pivotally connected by pin 128 to the first beam 122. A hoist motor 130 is attached to the distal end of the second beam 124 and a cable 131 extends downward therefrom to carry ice tong grippers 132. The ice tong grippers are comprised of two hollow tubes 134 into which extend bars 136 having gripping surfaces 138 at the distal ends, the tubes 134 being pivotally connected by pin 140. Screws 137 tightly hold the bars 136 in place within the tubes 134. The cable 131 is attached to lugs 142 of the tubes 134 such that upon actuation of the air hoist 130 to retract the cable 131, the hollow tubes 134 pivot about pin 140 to grip a series of bricks 144, the bricks then being lifted from the pallet and placed on the conveyor assembly 146.

As best seen in FIGS. 2, 3, 4 and 9, the platform 92 has been cut away between the horizontal support braces 94 so as to provide a channel opening 112 into which extends the conveyor assembly 146. Upper and lower flange means 114 and 116 provided on the horizontal support braces serve to support the conveyor assembly 146.

The conveyor assembly 146 is comprised of two spaced frame members 148 and 150, interconnected by cross support 152, end plate 154 and back and front plates 156 and 158. Support rollers 160 are journaled in the sides of the frame members 148 and 150 and engage the upper and lower flange means 114, 116 to support and allow free lateral movement of the conveyor assembly 146 within the channel opening 112. The frame member 150 has four rollers journaled therein while the frame member 148 has only two since frame member 150 will necessarily have to support a greater weight than member 148, as described hereinbelow. An axial air motor 162 is attached to the inner surface of the frame member 150 with one end connected to a push plate 164 and the other end connected to the end plate 95 of the carriage assembly 90. The air motor 162 serves the purpose of extending the conveyor assembly 146 outward toward the lining of the ladle or retracting it inward into the carriage assembly 90.

Two chains 166, provided between the frame members 148 and 150, serve as a conveyor to deliver bricks to the front end of the conveyor assembly 146. The chains 166 are mounted on two sets of sprockets 168, 174, the rear sprockets 168 being interconnected by a common shaft 172 journaled in support 170 on the rear plate 156 and the front sprockets 174 being interconnected by common shaft 175 journaled in support 176 attached to the cross support 152. The chains 166 are driven, in one direction only, by a conveyor indexing means 178 which is best seen in FIG. 5. The indexing means 178 comprises a one-way friction clutch sprocket 182 having an outer sprocket 184 with inner cam surfaces 190, an inner cylinder 186 mounted on the common shaft 172 of the rear sprockets 168 and a plurality of balls 188 located therebetween. A forward indexing sprocket 181 and an axial air motor 192 with piston rod 194 are mounted to a forward sprocket mount 180 attached to frame member 148. The piston rod 194 has attached thereto a chain connector 198 which in turn is connected to the ends of a chain 196 passing over the forward indexing sprocket 181 and the one-way friction clutch sprocket 182. Extension of the piston rod 194 will effect a clockwise rotation of the outer sprocket 184 which will cause the balls 188 to become tightly engaged between the cam surfaces 190 and the inner cylinder 186 so that the inner cylinder 186, and in turn the shaft 172, will rotate clockwise. This action causes the chains 166 to move bricks forward toward the front of the conveyor assembly 146. Upon retraction of the piston rod 194, however, the outer sprocket 184 rotates counterclockwise and the balls 188 disengage the inner cylinder 186, thereby imparting no counterclockwise rotation to the common shaft 172. Instead, the chains 166 remain stationary.

Located in the forward portion of the conveyor assembly 146 are three devices for placing and properly positioning the bricks in the wall of the lining 28 as they are delivered along the chains 166: a conveyor positioning mechanism 200, a brick pusher 236 and a brick gripper 264. The conveyor positioning mechanism 200, as best shown in FIGS. 4, 10, 11 and 12, serves a dual function of orienting the extension of the conveyor assembly 146 and also the height of the system relative to the lining of the ladle. A wheel holder 202 is attached to the conveyor assembly 146 and a dogleg connection by a pin 204 so as to allow pivotal movement of the wheel holder 202 thereabout. A support arm 210, pin connected to the wheel holder 202 by pivot pin 212, has journaled in its distal end a conveyor extension wheel 208 for riding along the interior surface of the lining 28. The conveyor extension wheel 208 controls actuation of the conveyor extending motor 162 so as to maintain a constant outward force against the interior of the ladle as bricks are being laid in place. Adjustment of the orientation of the conveyor extension wheel 208 is controlled by a pin 215 on support arm 210 passing through an adjusting slot 214 in the wheel holder 202 and held in place by a nut 216. A support cam follower wheel 206 is journaled in the front face of the wheel holder 202 for riding along the top row of bricks 144 in the lining 28 to control adjustment of the height of the carriage assembly [96] *90*. This is accomplished by means of a pressure regulator mounted in housing 220 on frame member 150. A pusher block 230 having a regulator plunger 232 adapted to enter the regulator is threaded on a screw 228 attached to the rear support plate 218 of the wheel holder 202. As the cam follower wheel 206 rides on the lining 28, the wheel holder will pivot about pin 204 to force the plunger [236] *232* into the regulator causing the air hoist 78 to actuate and raise the carriage assembly 90. A spring 222 shown in FIG. 4 is attached between a stop 226 and the support plate 218 to bias the wheel holder outward to force the plunger [236] *232* out of the regulator, thereby causing the air hoist to stop. Generally the spring force is sufficient to allow the cam follower wheel 206 to support about 5% of the weight of the carriage assembly 90. Thus it is apparent that an extra set of rollers 160 are necessary for supporting frame member 150 in the carriage assembly 90.

The brick pusher 236 as best shown in FIGS. 7 and 10–12 is attached to the other frame member 148 by means of an upright mounting plate 239 which supports a rotary air actuator 238 with a substantially vertically extending shaft 240. The shaft 240 has attached thereto at its lower end a linkage system comprised of a drive arm 242 having a drive arm extension 244 pinned at its distal end by pin 243. A drive arm wheel holder 246 having a drive wheel 250 pinned thereto by pin 252 is integrally attached at an angle to the drive arm extension 244 such that the wheel 250 will rotate in a plane parallel to the upper surface of the lining 28. A linkage arm 248 pinned to the air motor 238 by pivot pin 247 and pinned to the drive arm extension 244 by pivot pin 249 controls the relative motion of the arm 244. As can be seen in the sequential views of FIGS. 10–12 as the shaft 240 is rotated in a counterclockwise rotation the drive wheel 250 travels along a fixed path to engage the lastly laid brick and push it into place in the lining 28.

Operation of the brick pusher 236 is controlled by two limit switches 257 and 261 positioned on a mounting plate 256 and the top surface of the air motor 238 respectively. A shaft block 154 attached to shaft 240 has adjustably positioned thereon two actuating members 258 and 262. Upon actuation of the air motor 238, the shaft 240 will rotate in a counterclockwise motion, forcing the lastly laid brick 144 against the next to lastly laid brick in the lining 28 until the forward limit switch 261 is actuated by the plate 262. A signal will then be sent to reverse the motion of the shaft 240 to return the brick pusher to its retracted position, the operation of the air motor 238 ceasing when the block 258 actuates the return limit switch 257.

The brick gripper 264 for placing a brick 144 in the lining 28 is positioned on two base pads 270 on the front of the front plate 158, and comprises an air motor 266 which rotates a shaft 268 extending outward from both sides thereof as best seen in FIGS. 6 and 10–12. Two spaced arms 272 and 282 are attached to the protruding ends of the shaft 268. Swing arm 272 is attached to the shaft 268 by means of two spaced flanges 274 engaging a block 276 rigidly fixed to the shaft 268 and a pivot pin 278 passing therethrough. The distal end of the swing arm 272 is provided with a gripping pivot point 280 for gripping one end of the brick 144 and allowing the brick to rotate thereabout. The positioning arm 282 is rigidly fixed to the shaft [266] *268* so as to only rotate therewith. The distal end of the positioning arm 282 is provided with a rotating gripper 284 and a sprocket 288 interconnected by a shaft 286 journaled in the arm 282. A clamping axial air motor 308 is pin connected to the positioning arm 282 by pin 312, and has a piston rod 310 connected to the swing arm 272 by pivot pin 314. Retraction and extension of the piston rod within air motor 308 will cause the swing arm 272 to pivot about the pin 278 to grip or release, respectively, a brick 144 between the gripping point 280 and the rotating gripper 284.

Figure 6:
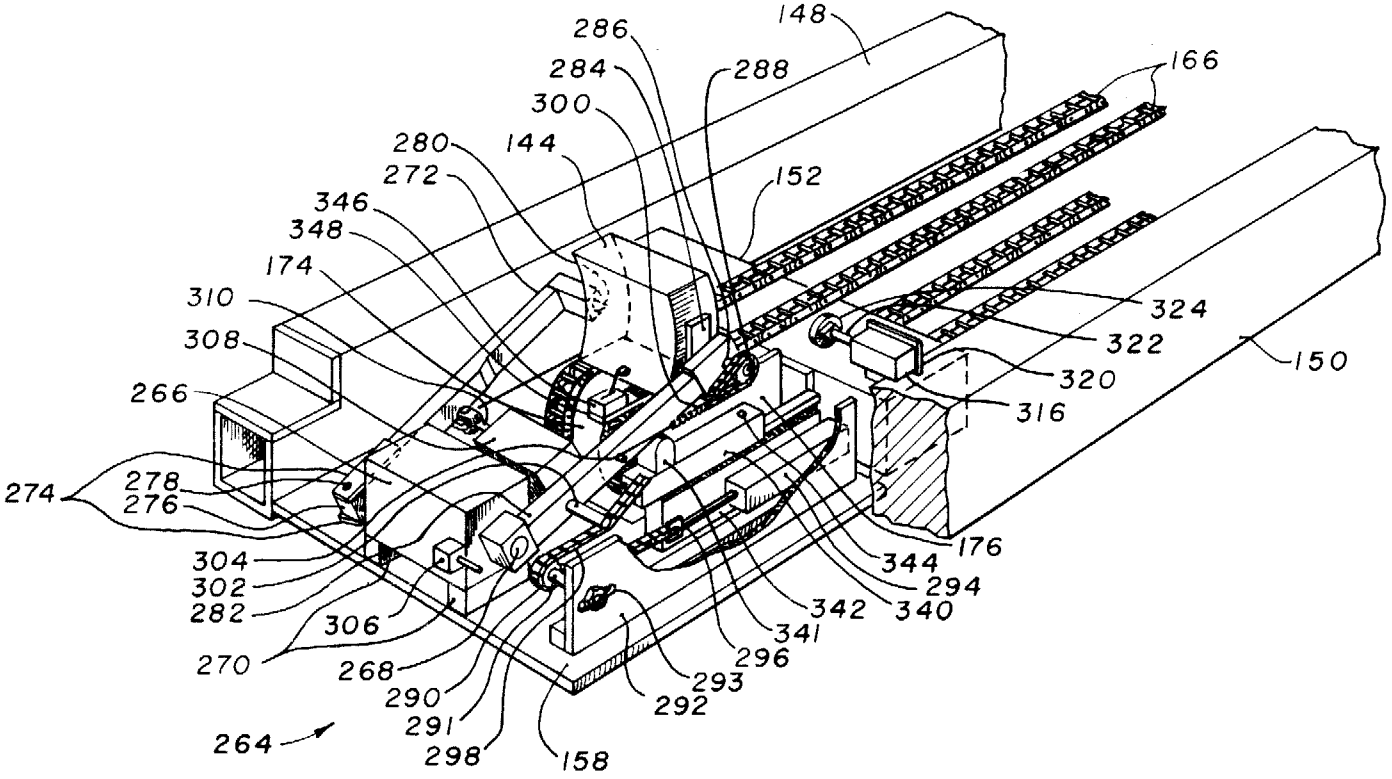
FIG. 6 is a perspective view of the brick gripper according to the present invention.
Figure 7:
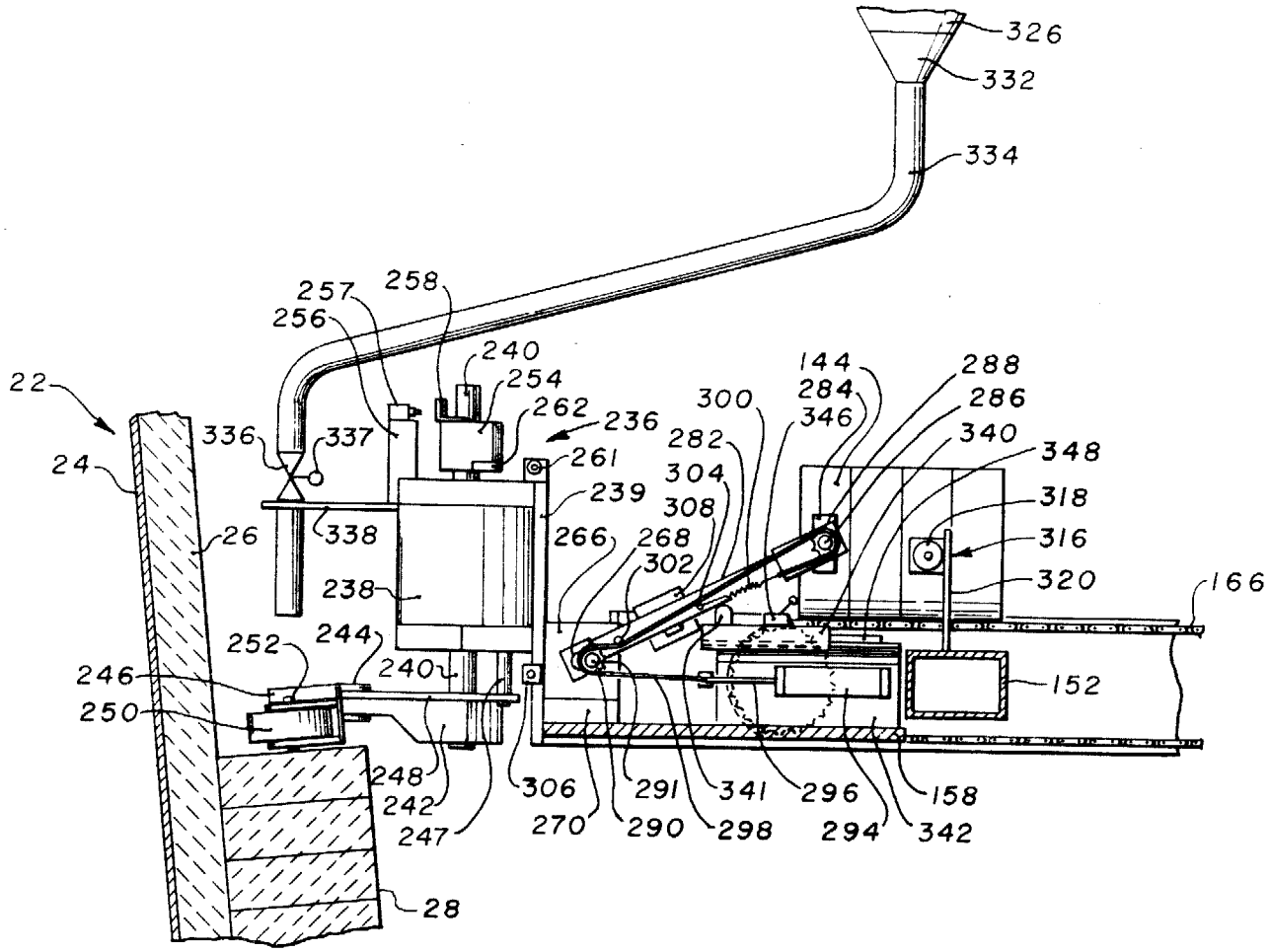
FIG. 7 is an elevation view of a portion of the conveyor assembly taken along line 7—7 of FIG. 11.
Figure 10:
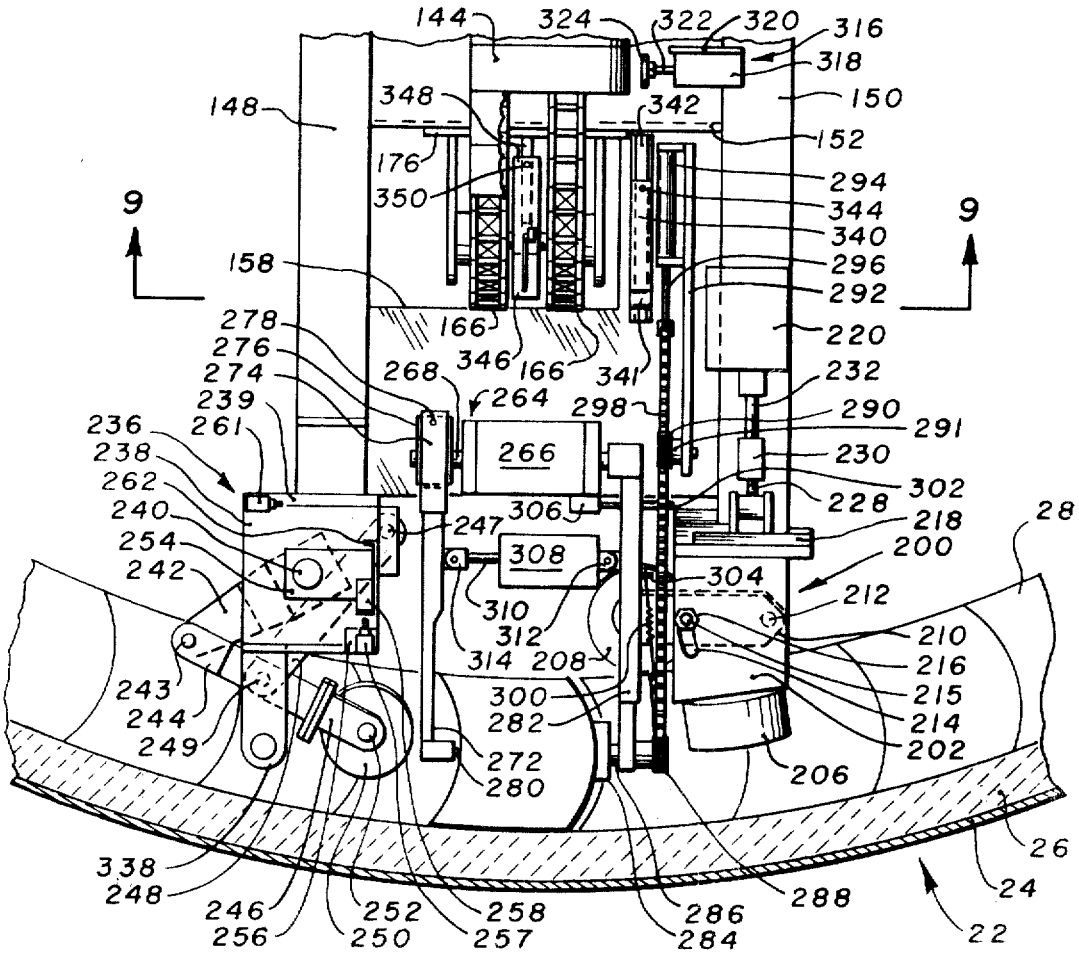
FIGS. 10, 11 and 12 are detailed plan views of a portion of the conveyor assembly showing the sequential operations according to the present invention in laying a brick in the lining of the ladle.
Figure 9:
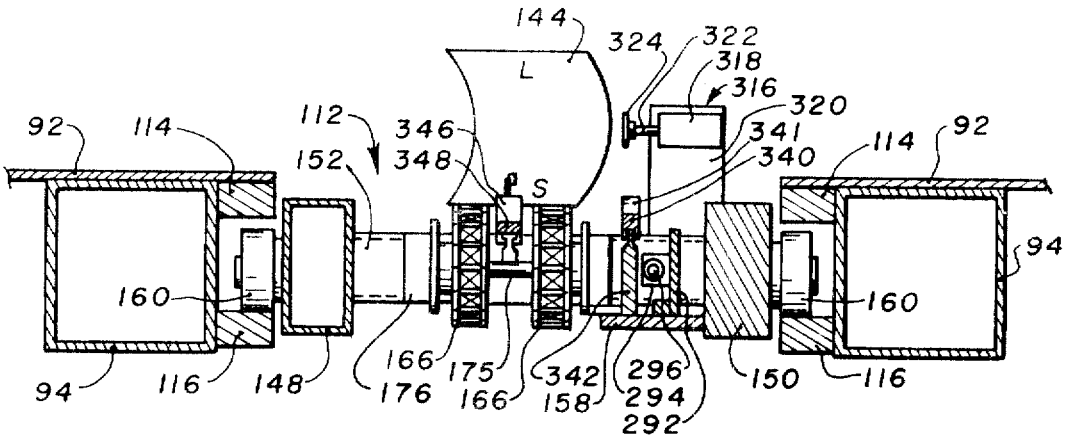
FIG. 9 is a front elevation view of the conveyor assembly taken along line 9—9 of FIG. 10.
Figure 11:
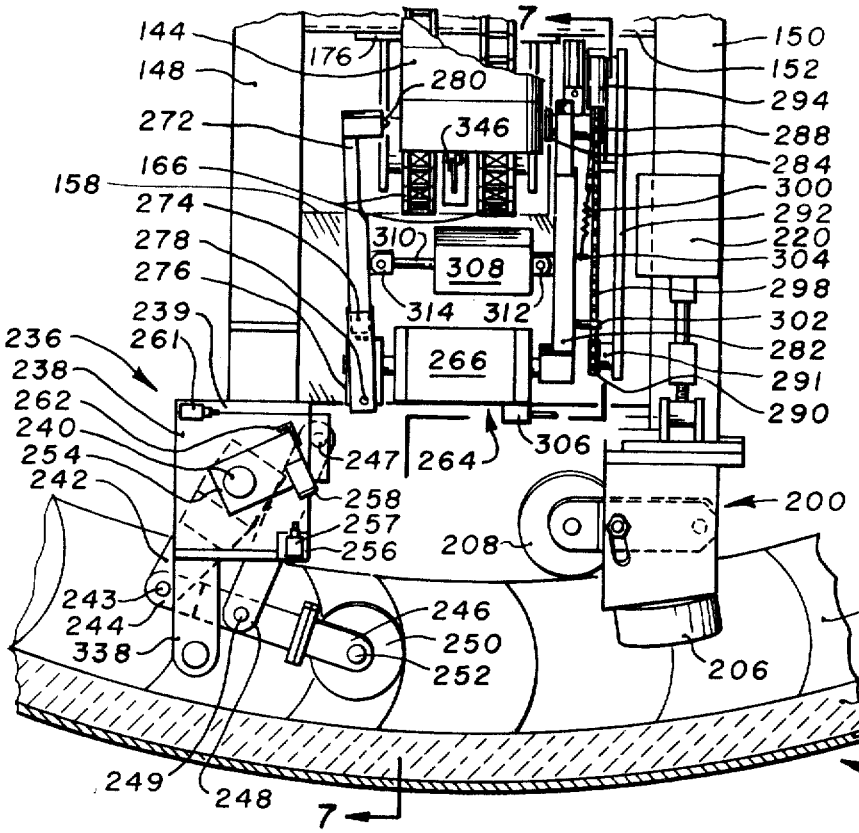
Figure 12:
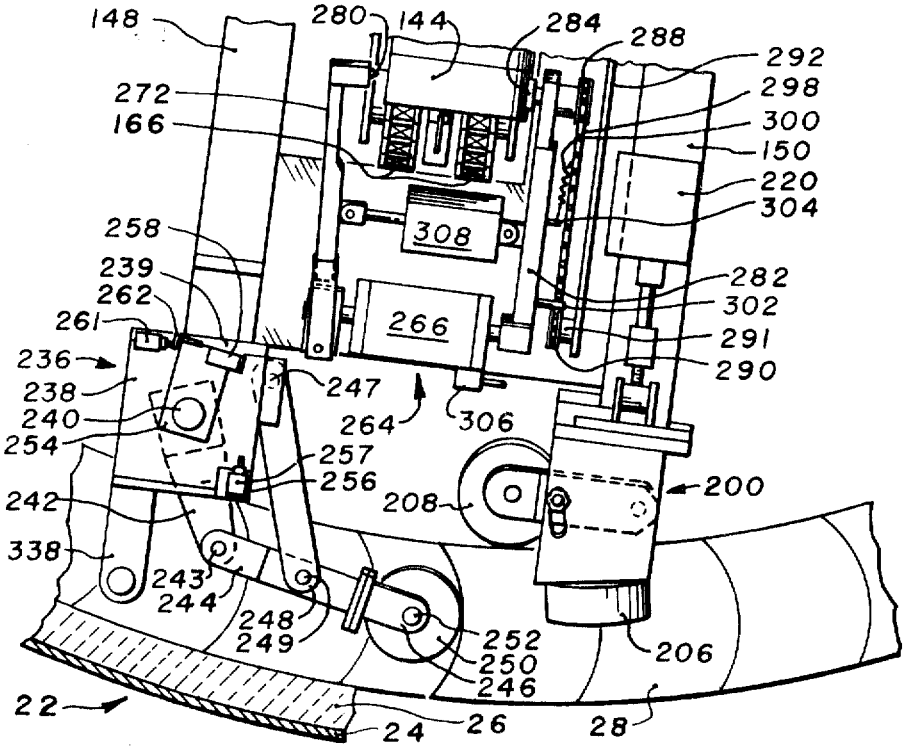

As best shown in FIGS. 6, 7 and 10, a fixed sprocket 290 is rotatably mounted on a shaft 291 which is adjustably fixed within a slot 293 in a mounting bracket 292 affixed to the front plate 158 in spaced relation from the air motor 266. The vertical elevation of the shaft 291 is substantially the same as that of the shaft 268 of the air motor 266. Positioned on the rear of the mounting bracket 292 is an axial air motor 294 with a piston rod 296 extending outward therefrom toward the fixed sprocket 290. A chain 298 is mounted around a roller 302 journaled in the side of the positioning arm 282, and the two sprockets 288 and 290, one end of the chain being mounted to the piston rod 296 and the other end being fixed to a spring 300 attached to the side of the positioning arm 282 by pin 304.

Figure 8A:
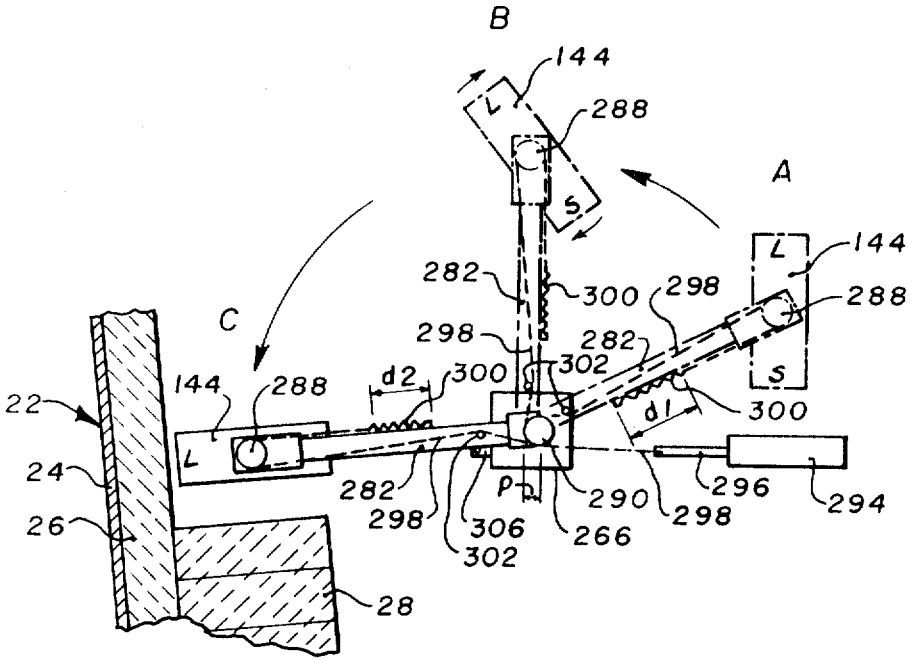
FIGS. 8A and 8B are diagrammatic representations showing the operation of the brick gripper according to the present invention.
Figure 8B:
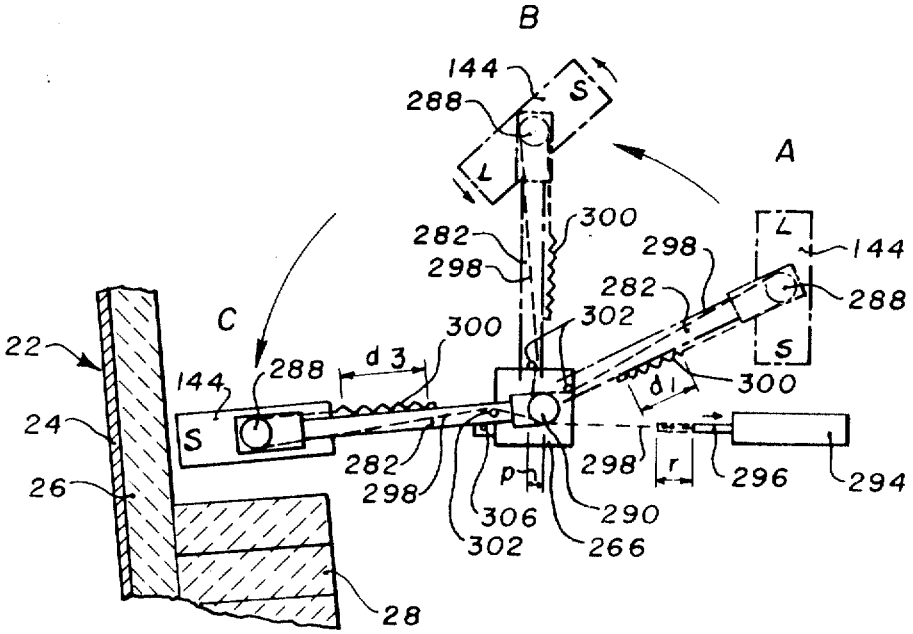

The bricks 144 are delivered in what is termed an upright position lying on a longitudinal edge to the front of the conveyor assembly 146 where the brick gripper 264 grasps the bricks and translates them to the wall of the ladle 22 to form the lining 28 thereof. The bricks must be reoriented from the upright position to a horizontal position since the bricks of the lining 28 lie on one side wall surface with one of the longitudinal edges abutting the safety lining 26 and the other longitudinal edge facing inward toward the center of the ladle. As previously noted, the bricks are standard refractory bricks generally described in U.S. Pat. 3,140,333 with one of the longitudinal edges being longer than the other. Normally, in a circular ladle, the longer of the two longitudinal edges is placed against the safety lining 26 so that successive bricks in the lining naturally arc or bend to conform to the circular surface of the ladle. Often, however, the size of the ladles used in steel shops is increased by making the ladles elliptical in fashion with flat spots or regions on the circumference of the ladle. In this situation, it is necessary along the flat region to alternately reverse the orientation of the bricks so that the short longitudinal edge is alternately placed against the ladle safety lining 26 to form a straight region of lining. This is shown at flat region 29 on FIG. 3, the "S" denoting a short longitudinal edge and "L" denoting a long longitudinal edge. It is this dual reorientation of the bricks with which the chain 298 and sprockets 288, 290 are concerned, the operation of which is best seen in FIGS. 8A and 8B.

The center of the fixed sprocket 290 is positioned behind the pivot point of the gripper arm 282 so that rotation of the arm 282 will cause a change in the distance along the path of the chain 298 between the end of the piston rod 296 and the sprocket 288 on the arm 282. The spring 300 connected to the end of the chain 298 either extends or compresses to accommodate this change in distance and in turn causes the sprocket 288 to rotate relative to the arm 282. For rotation of the arm 282 from position A to position C in FIG. 8A, the distance becomes less and the spring 300 compresses to pull the chain 298 around the sprocket 288 thereby causing a clockwise rotation of the sprocket and brick relative to the arm 282. For example, in position A, the arm 282 is oriented at an angle of [26°–½°] *26½°* and picks up a brick [244] *144* lying on its short longitudinal edge (denoted by "S"). The initial length of spring 300 is "$d_1$" and the center of the fixed sprocket is spaced a distance "p" behind the pivot point of the arm 282. When the rotary air motor 266 is actuated, the arm 282 rotates counterclockwise 159° through position B to position C where the bricks 144 are released, the arm 282 being [5°–½°] *5½°* below the horizontal, and the brick 144 having rotated clockwise [63°–½°] *63½°* so that it is roughly parallel to the top surface of the lining 28. The spring 300 has compressed to a length "$d_2$." The distance "p" between the center of the sprocket 290 and the pivot axis of the arm 282 depends on the size of the sprockets 288 and 290 and the amount of rotation of the arm 282 and may be determined empirically in order to effectuate the desired rotation of the brick 144.

For the situation where the brick 144 is to be laid in the lining 28 in a reverse orientation, (i.e. the short longitudinal edge abutting the safety lining 26) the piston rod 296 of the air cylinder 294 is retracted to rotate the brick 144 counterclockwise during rotation of the arm 282 by the air motor 266. Using the same example as above for FIG. 8A, the brick 144 is initially grasped when the arm 282 is in position A with the spring 300 having a length "$d_1$," and the piston rod 296 extended fully. However, as the arm 282 is rotated from position A through B to C, the piston rod 296 is retracted a distance "r," causing the brick 144 to rotate counterclockwise [116°–½°] *116½°* relative to the arm 282 such that the short longitudinal edge is adjacent the lining 26, In this situation, the spring 300 stretches from "$d_1$" in position A to "$d_3$" in position C. Again the distances "p" and "r" are dependent on the size of the sprockets 288, 290 and the amount of rotation of the arm 282 and may be determined empirically.

Of course it should be understood that there are other ways of combining the spring 300, the chain 298, and the two sprockets 288, 290 to properly reorient the brick 144 before it is placed in the lining 28 of the ladle 22. This may be accomplished simply by wrapping the chain 298 in the opposite direction around the sprocket 288, that is, first passing the chain 298 underneath and then around the top of the sprocket 288 to the spring 300. In this situation the spring 300 would stretch and the sprocket 288 would rotate clockwise during the rotation of the arm 282 for laying both a normal oriented and a reverse oriented brick 144. Or the size of the sprockets 288, 290 could be varied and the separation between the center of the fixed sprocket 290 and the center of rotation of the arm varied, or even the position of the fixed sprocket 290 could be changed. The only thing necessary in making these changes is to ensure that it is possible to effectuate two different amounts of angular rotation of brick 144 as the arm 282 is rotated from position A (picking brick up) to position C (releasing brick).

Also provided on the front plate 158 of the conveyor assembly are several mechanisms for controlling the operation of the brick laying machine 20. As shown in FIGS. 6 and 7, an arm stop slide 340 is adjustably positioned along a bracket 342 by means of a screw 344. An upward protruding member 341 is provided on the arm stop slide 340 for controlling the height of the gripper arms 272, 282 when picking up a brick 144. Forward motion of the arms 272, 282 is controlled by a limit switch 306 which in the preferred embodiment in FIG. 6 is shown to be attached to the front of the air motor 266. Upon actuation of limit switch 306, the arms 272, 282 stop rotating and the brick 144 held therebetween is released, with the arms then returning to pick up another brick. The advancement of the bricks 144 along the chains 166 is controlled by a brick limit switch 346 attached to a bracket 348 adjustably locatable on the front sprocket support 176 by means of a screw 350 as shown in FIGS. 7 and 10. Upon actuation of the limit switch [348,] *346*, the bricks are stopped and remain stationary until the forwardmost brick is picked up by the gripper 264.

A brick aligner mechanism 316 for ensuring alignment of the bricks 144 on the conveyor chains 166 comprises an axial air motor 318 adjustably mounted on a bracket 320, positioned on the frame member 150 as shown in FIGS. 6, 7, 9 and 10. The axial air motor 318 has a piston rod 322 to the end of which is attached a disc 324. As the bricks 144 are advanced along the chain 166, the air cylinder 318 is periodically actuated to extend the disc 324 to push the bricks transversely on the chain 166 thereby aligning them for pickup by the gripper mechanism 264.

Also positioned on the conveyor assembly 146 is a mortar bucket 326 supported by a cross support 330 connected to two uprights 328 mounted on frame members 148 and 150 as shown in FIGS. 1, 2 and 7. The mortar bucket 326 contains a slurry type mortar delivered to the lining 28 by gravity in a flexible hose 334, one end of which is connected to the lower nozzle 332 of the mortar bucket 326 and the other end of which is positioned in a hose support 338 extending outward from the air motor 238. A control valve or clamp means 336 having an actuator 337 is provided for controlling the flow of mortar to the lining. It should be noted that the use of mortar is not necessary due to the interlocking action of the bricks 144, but is merely shown for the situation where it is desired to supplement the holding of the bricks in place in the lining.

The operation of the automated bricklaying device 20 is as follows. The ladle 22 is cleaned of excessive slag and dirt accumulation and inspection and repair of the bottom and the safety lining 26 is undertaken in the conventional manner. The bottom brick lining and well block are laid up as is the skew brick ring which is comprised of one tapered starter set 27 and several spiraling courses of semi-universal refractory brick 144, also in the conventional manner. The tapered starter set is necessary to provide that the working lining 28 is built up by spiraling courses.

The automated bricklaying device 20 is then lowered into the ladle, either as a whole unit or in components as previously noted and leveled by screw jacks 40 on turntable 30 to rest on the bottom brick lining. The bricklaying machine may then be connected to a power source and operated in a manner to be described hereinbelow.

As previously noted, the bricklaying device 20 in the preferred embodiment is a totally air operated device as opposed to, for example, an electrically operated device. This is merely a matter of preference, depending on the type of shop in which the bricklaying machine will be used and the capabilities thereof, and it makes no major difference what type of power source is employed. It is conventional in most steel shops to use air as a source of power to operate various devices for operation therein and, as such, air was initially chosen to supply the power for operation.

Figure 14A:
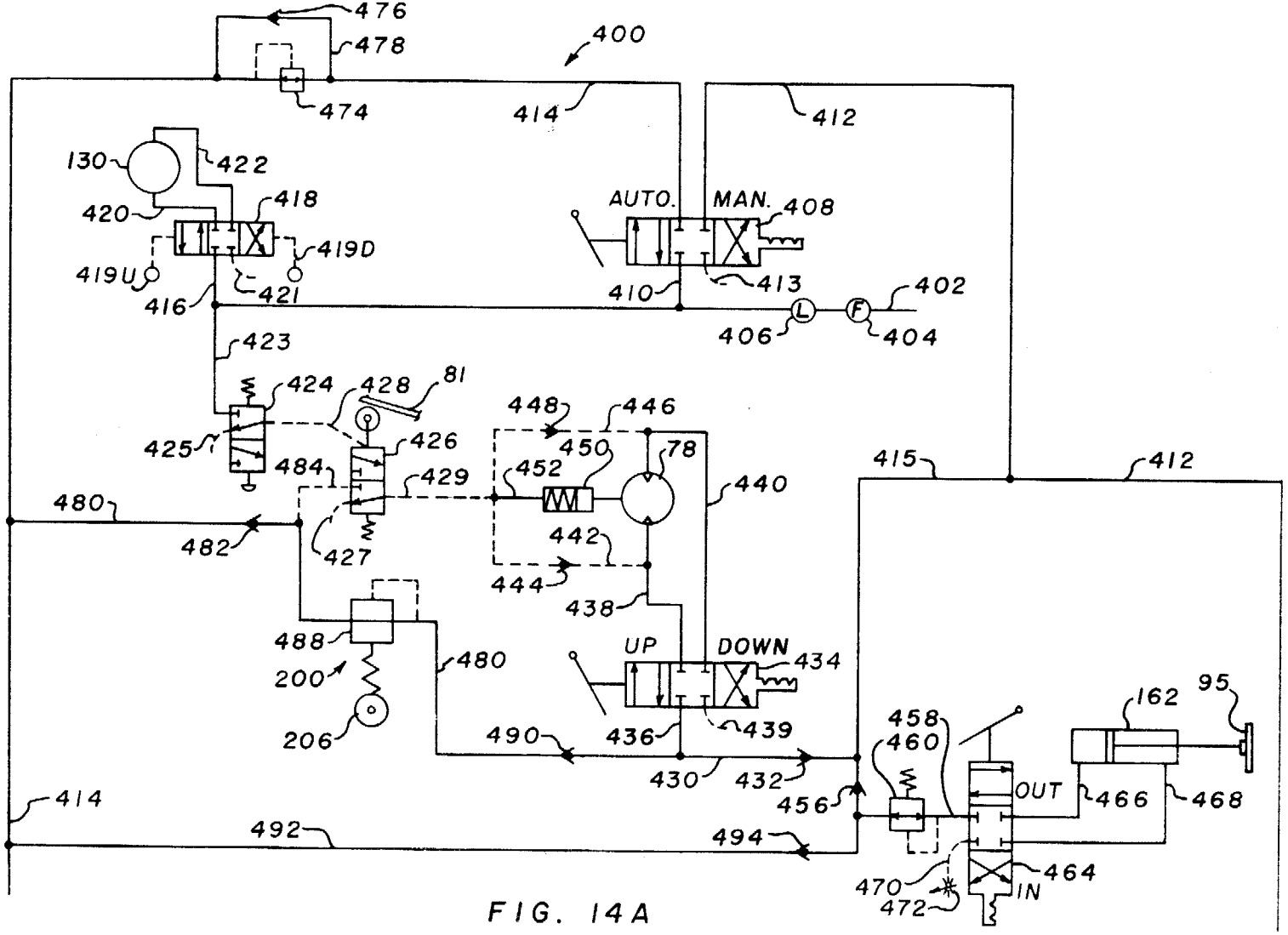
FIGS. 14A and 14B are diagrammatic representations of the control system according to the present invention.
Figure 14B:
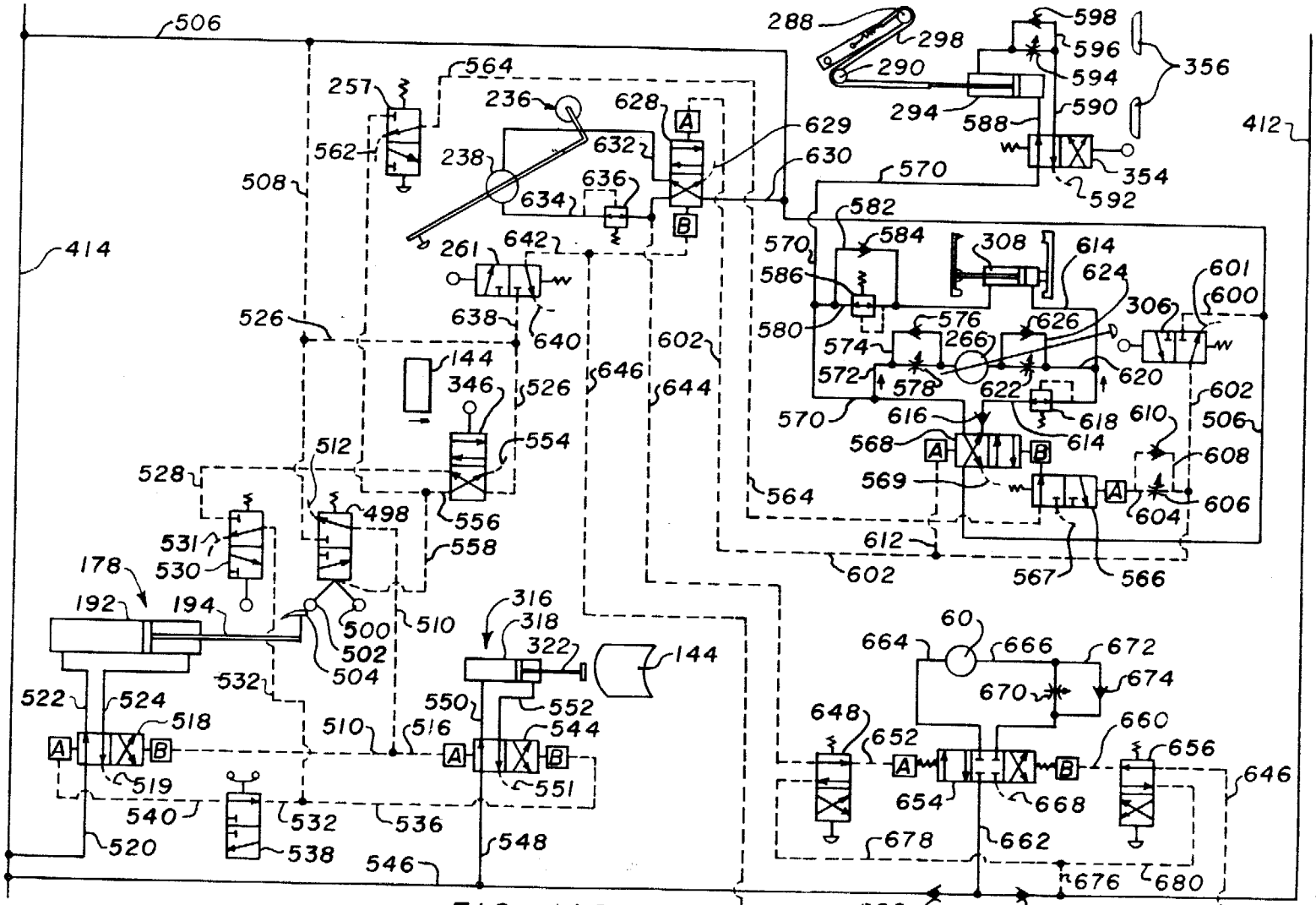

The particular control diagram 400 for the preferred embodiment is depicted diagrammatically in FIGS. 14A and 14B. As a key to aid in understanding the diagrammatic representation, the following should be noted. The numbers 412 and 414 on FIG. 14A represent typical main air supply lines for operating the various air motors and air cylinders of the bricklaying machine 20; the numbers 428 and 442 on FIG. 14A represent typical pilot lines for switching control valves from one position to another; the number 476 on FIG. 14A represents a typical check valve which permits air to flow in the line 478 in one direction (to the right) and prohibits air flow in the other direction (to the left); the number 594 of 14B represents a typical adjustable flow control valve to control the flow of air therethrough; the number 474 on FIG. 14A represents a typical pressure regulator which controls the amount of air pressure delivered to the left-hand portion of the line 414; the number 424 on FIG. 14A represents a typical mechanically actuated control valve with a spring return which will return to its normal position upon release of the operator; the number 518 on FIG. 14B represents a typical air actuated control valve whose position is changed by providing air to one of the chambers "A" or "B," the valve remaining in that position until air is provided to the other of the chambers; and the numbers 408 on FIG. 14A and 538 on FIG. 14B represent typical manually actuated control valves whose position is changed manually and maintained thereat by detents.

With the above brief description of the diagrammatic representation in FIGS. 14A and 14B, the operation of the bricklaying machine 20 is as follows. The main supply of air to the machine is provided from a compressor (not shown) by the supply line 402, a filter 404 and lubricator 406 being provided in the line 402 so that the air to the system is clean and lubricated. Air is supplied by branch line 416 to the control valve 418 to operate the air hoist 130 of the boom mechanism 118 independent of the rest of the system. The control valve 418 is a three-position valve for controlling the air motor 130 to raise, to lower, or to stop the cable 131. Actuator 419U shifts the valve 418 to supply air from line 416 to line 420 to raise the cable 131, with air in down line 422 exhausting through vent line 421 while the actuator 419D shifts the valve 418 to the other side so that air is delivered to the down side of the air motor 130 to lower the cable 131.

The remainder of the operation of the bricklaying machine is controlled by the three-position manually-actuated valve 408 which, in FIG. 14A, is shown in a neutral position sending no air to the system. Initially the valve 408 is placed in the "manual" position so that air will be provided from the branch line 410 to the main manual control line 412, and the air in the automatic line 414 will exhaust to the atmosphere through vent line 413. The main hoist valve 434, as with the valve 408, is a three-position valve to which air is delivered via lines 412, 415, 430 and 436 to control the air hoist 78 for raising and lowering the carriage platform assembly 90 on the elevator frame assembly 64. The control system is also provided with a conventional spring biased brake 450 and a slack cable limit switch 426 for restricting operation of the air hoist 78. The brake 450 automatically locks the air hoist 78 in place if no air is sent to it along pilot line 452 and the slack cable limit switch releases the air in line 429, 452 if the cable 81 of the hoist 78 is slack, the slack position being shown in FIG. 14A. If the cable 81 is not slack, the valve 426 is depressed so that no air will be released from line 429 as described hereinafter. Pilot air is delievered for manual operation by pilot lines 442 and 446 joined to the air hoist up and down lines 438 and 440 respectively. Check valves 444 and 448 are positioned in pilot lines 442, 446 to prevent a reverse flow from one pilot line to the other, which would prevent release of the brake 450.

Lowering of the cable 86 of the hoist 78 and thus the carriage assembly 90, is accomplished by placing valve 434 in the "down" position so that air will be provided from line 436 through line 440 to both the brake 450 and the "down" side of the air hoist 78. Air is released from the "up" side of the motor 78 through the "up" line 438 to vent line 439. The carriage assembly 90 is lowered until it is at the approximate height necessary to start laying bricks in the lining, in which case the valve 434 is placed back in its neutral position (see FIG. 4). Next, the conveyor assembly 146 is extended from beneath the carriage assembly 90 so that the conveyor extension wheel 208 rides against the inner surface of the lastly laid bricks in the lining 28. The conveyor extension valve 464 is placed in the "out" position and air is delivered to the extension air motor 162 by lines 412, 415, 458 and 466. A pressure regulator 460 in the line 458 controls the amount of air pressure in line 458 to the right of the regulator 460 and as such the amount of pressure delievered to the extension motor 162. Normally the regulator 460 is set so as to provide a sufficient force on the conveyor extension wheel 208 to properly set the bricks 144 in the lining 28 against the safety lining 26, this occurring as the conveyor assembly [90] *146* revolves around the circumference of the ladle, notwithstanding the fact that the turntable assembly is not positioned in the center of the ladle and notwithstanding the fact that the ladle may be elliptical. As air is delivered to the extension motor 162 by line 466, air in the "in" line 468 is controllably released to the atmosphere through the vent line 470 and flow control valve 472 situated therein.

After the conveyor assembly 146 has been properly positioned against the lining 28, the carriage assembly is again lowered until the cam follower wheel 206 rests on the top surface of the lining 28. A manual override valve 424 has been provided where it is desired to release the brake 450 when the cable 86 on the air hoist 78 is slack, such as might occur if the hoist 78 were lowered too far when the cam followed wheel 206 rested on the lining 28. When the valve 424 is actuated, air passes from branch line 423 to pilot line 428 to actuate the slack cable limit switch 426 so that air in line 429 is not released to the atmosphere through vent line 427, but instead passes to release the brake 450. Although the valve 426 is positioned to pass air from line 429 through line 484 to line 480, no such passage occurs due to the check valve 482 being situated in line 480. Normally the manual override valve 424 is positioned so that any air in pilot line 428 is released to the atmosphere throuhg vent line 425.

After the carriage assembly 90 is properly positioned within the ladle the main control valve 408 is shifted to provide air to the automatic line 414 and drain air in the manual line 412 through vent line 413. The air pressure in the automatic line 414 is controlled by the pressure regulator 474, a bypass line 478 with check valve 476 being provided in parallel to allow drainage of the automatic line 414 when the valve 408 is in a "manual" position. For automatic operation, the main hoist valve 434 is placed in an "up" position and a pilot line 484 from line 480 provides air to release the brake 450 if the cable 86 is not slack. A pressure regulator 488 in line 480, controlled by the conveyor positioning mechanism 200 as described hereinabove, serves to provide air to the hoist 78. If the plunger 232 (see FIG. 4) is not depressed into the regulator due to the force exerted by spring 222 being greater than that exerted on the cam follower wheel 206, then no air is allowed to pass through the regulator to line 436 to actuate the hoist 78 to raise the carriage assembly 90. Instead, since the brake 450 is released, the carriage assembly 90, and thus the conveyor assembly 146, will start to move downward along the elevator frame assembly 64. As the force on the cam follower wheel 206 forces the plunger into the regulator 488, air from line 480 is allowed to pass through the regulator to the main hoist valve 434 to actuate the hoist mechanism 78. As the hoist mechanism is actuated, the conveyor assembly 146 is raised, relieving the weight which the cam wheel 206 supports until the spring 222 forces the regulator plunger 232 out of the regulator 488 to stop the flow of air therethrough. The conveyor assembly 146 continues to oscillate, falling downward since the brake 450 is released and rising since the plunger 232 is inserted, until a balance of forces is maintained in which the conveyor assembly rests at the proper height. The air hoist 78 is periodically actuated as the cam wheel 206 rides on the spiraling courses of bricks built up in the lining 28 and thus this type of mechanism provides a self-regulating control of the height of the carriage assembly 90 in the ladle 22. Alternatively, a limit switch could be used in place of the pressure regulator 488 if precise modulating control of the height of the platform is not required.

Air from the automatic line 414 is provided to the extension motor 162 by branch line 492 which connects to the line 458, the operation of the extension motor 162 being as previously described for manual operation with the valve 464 in an "out" position. Check valves 490, 432, 494, and 456 are provided in branch lines 480, 430, 492 and 415 respectively so that the air in these lines will not be released to the atmosphere during either automatic operation or manual operation. These check valves are necessary since both the automatic and manual lines are commonly connected to the branch lines 436 of the main hoist valve 434 and 458 of the main conveyor extension valve 464.

With the conveyor assembly 146 properly positioned relative to the circumference of the ladle 22 and ready for operation to lay bricks, the boom mechanism 118 is operated to place bricks 144 on the conveyor chains 166. The stop-start switch 538 is then placed in a start position (as shown in FIG. 14B allowing air to pass between pilot lines 532 and 540) and the manual operator 500 on the front index switch 498 is actuated. Air passes from line 508 through the valve 498 to the pilot line 510 into chamber "B" of conveyor indexing valve 518 to switch valve 518 so that air passes from branch line 520 to return line 524 to retract the piston rod 194 of the indexing motor 192, air from the other side of the motor 192 being exhausted through extension line 522 and vent line 519. Pilot air from line 510 is also provided to chamber "A" of the brick aligner valve 544 by line 516 so that air from line 548 passes through valve 544 to line 550 to extend the piston rod 322 of the brick aligner motor 318 to align the bricks 144 on the chains 166. The piston rod 194 of the conveyor indexing motor 192 is retracted until the rod actuator 504 engages the operator of the rear indexing switch 530 to allow pilot air in line 528 to pass through valve 530 into pilot line 532. Pilot air is initially delivered to pilot line 528 from pilot line 508 via line 526 which passes through the brick limit switch 346 as long as a brick 144 does not engage the operator of the valve 346. The air in line 532 passes through the stop-start switch 538 into chamber "A" to switch valve 518 to extend the piston rod 194 of the conveyor indexing motor 192. At the same time, pilot air in line 532 is delivered by line 536 to chamber "B" of the brick aligner valve 544 causing the valve to change positions to retract the piston rod 322 of the brick aligner cylinder 318. The piston rod 194 is extended until the rod actuator 504 engages the operator 502 of the valve 498 to return the rod as previously described by manual actuation of operator 500.

This sequence of operation of advancing bricks 144 along the length of the conveyor assembly 146 continues until a brick 144 actuates the operator of the brick limit switch 346 to switch the valve 346 to pass air therethrough from line 526 to line 556. Pilot air is then delivered by line 558 into a chamber in valve 498 to actuate the valve 498 for returning the piston rod 194 in the indexing cylinder 192. However, when the rod actuator 504 engages the operator of valve 530, the valve 518 will not switch to extend the rod 194 until the brick 144 is removed to release the brick limit switch 346 since air is not then being delivered to line 528. As thus far described, each of the valves and limit switches 498, 530 and 346 are provided with vent lines 512, 532 and 554 respectively so that any air in the connecting lines is released to the atmosphere. This is necessary since the air in either chamber "A" or "B" of valves 518 and 544, if not released, would oppose the air sent to the other of the chambers and would thus prevent switching of the valves 518 and 544.

After a brick 144 has actuated the valve 346, the air in line 556 passes to valve [261] *257* of the brick pusher mechanism 236 which is actuated to allow air into line 564 only when the brick pusher mechanism is in a return position. The air in line 564 then passes to chamber "B" of the gripper control valve 568 to switch the valve to allow air to pass therethrough from line 506 to line 570. The air in chamber "A" of valve 568 is exhausted through vent line 601 via lines 612, 602. From line 570, the air is delivered to the clamp cylinder 308 by line 580 which has a pressure regulator 586 positioned therein for controlling the clamping force applied by the motor 308 in order not to crush or crack the bricks grasped by the arms 272, 282. A bypass line 582 with check valve 584 is connected in parallel across the pressure regulator 586 to provide a quick exhaust of air from the clamp motor 308 when the signal is given to release the brick. Line 570 also delivers air to the rotary air motor 266 by line 572 to take the brick 144 from the chains 166 and place it in the wall of the ladle 22, the motion being clockwise as shown in FIG. 14B. A check valve 576 in bypass line 574 is connected in parallel across a flow control valve 578 in line 572, the check valve 576 passing air quickly to the air motor 266 while preventing back flow therefrom and the flow control valve 578 controlling the air released from the air motor 266 during the return thereof to pick up another brick.

Figure 13:
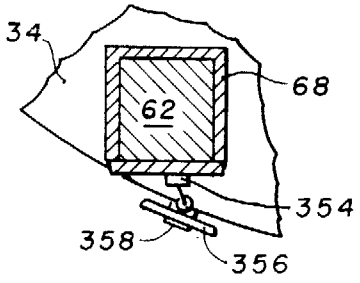
FIG. 13 is a detailed view showing the actuation of a limit switch utilized in the control of the present invention.

The air in line 570 also passes through the valve 354 located on the base of the connecting couple 68 of the elevator frame assembly 64 to control the operation of the sprockets 288, 290 and chain 298 on the gripper arm 282. If the operator on the valve 354 has not been actuated, then air is delivered to line 588 to keep the piston rod extended in the air motor 294. Actuation of the operator on the valve 354 can best be seen in FIG. 13 wherein the upper platen 34 has rotated relative to the lower platen 32 such that the limit switch 354 is located adjacent to the cam trippers 356 supported by supports 358 from the bottom platen 32. As the upper platen 34 continues to rotate relative to the lower platen 32, the operator of the limit switch 354 will be depressed by the cam tripper 356 thus causing the valve 354 (see FIG. 14B) to shift positions so that air in line 570 is delivered to line 590. The air in line 590 passes through a flow control valve 594 to the air cylinder 294 to controllably retract the piston rod 296 as the gripper arms 272, 282 rotate to lay a brick in the lining 28. A bypass line 596 with check valve 598 is provided in parallel to control valve 594 so that air will be exhausted quickly through line 590 to vent line 592 when the valve 354 is not actuated by the cam tripper 356.

As the gripper arms 272, 282 rotate to deliver the brick 144 to the circumference of the ladle 22, the arm 282 engages and actuates a limit switch 306 as best seen in FIG. 6. Referring again to FIG. 14B, when the limit switch 306 is actuated, air is provided from pilot line 600 to line 602 and, in turn, to lines 612 and 604. Pilot air in line 604 enters chamber "A" of valve 566 to shift the valve to release the air in chamber "B" of valve 568 through vent line 567, and pilot air in line 412 enters chamber "A" of valve 568 to shift the valve 568 so air is supplied from line 506 to line 614. Flow control valve 606 positioned in line 604 restricts the release of air from chamber "A" of valve 566 in order to provide a time delay before air may again be delivered to chamber "B" of valve 568 to cause actuation of the motor 266 to lay a brick. Bypass line 608 with check valve 610 is provided in parallel to the flow control valve 606 in order to effect a quick shifting of valve 566. The air in line 614 is passed to extend the piston rod of the clamp motor 308 to release the brick held thereby and is also sent, via branch line 620, to return the brick gripper arms 272, 282 to pick up another brick 144. A bypass line 624 with check valve 626 is connected in parallel fashion across the flow control valve 622 in line 620 so that air will be quickly sent to the air motor 266 to return the arms 272, 282, and will be released through the flow control valve 622 upon actuation of the air motor 266 to lay a brick. The pressure regulator 618 in line 614 is set so that only a small amount of air, which is all that is needed to effect the return of the brick gripper and release of the brick, is delivered to the air motor 266 and the clamp motor 308. A check valve 616 is placed in line 614 so as to allow a build-up of air on the return side of the motor 266 when laying a brick in order that the brick is not slammed into the lining. When the valve 568 is in the position shown in FIG. 14B, air in line 570 is released to the atmosphere by vent line 569.

Pilot line 602 also delivers air to chamber "A" of the brick pusher valve 628 to switch the valve to allow air to pass from line 630 into line 634 to the push side of the air motor 238, thus actuating the brick pusher mechanism 236 to push the brick 144 into place against the lastly laid brick in the lining 28. A pressure regulator 636 is provided in line 634 in order that the force of the brick pusher 236 does not become too great so as to crush bricks. Air in the return side of the motor 238 is quickly exhausted through vent line 629. As the brick pusher 236 is actuated, air is also sent to actuate the turntable air motor 60. Pilot line 644 continuously delivers air through the normally unactuated control valve 648 to line 652 into chamber "A" of turntable control valve 654 to force the valve into position to allow air to pass from line 662 into line 664, thereby actuating air motor 60 to turn the turntable 30 clockwise. The valve 654 is a three-position air actuated, spring biased valve such that when air is not being continuously provided to chamber "A" or "B," then the spring bias will force the valve 654 into a neutral position as shown in FIG. 14B. The brick pusher mechanism 236 is more quickly actuated than the turntable air motor 60 since a flow control valve 670 is positioned in line 666 to controllably exhaust the air in the other side of the air motor 60 through the vent line 668. A bypass line 672 with check valve 674 is connected in parallel across the flow control valve 670 to allow air to pass quickly in line 666 to the counterclockwise rotation side of the air motor 60 if the valve [668] *654* were in position to deliver air from line 662 to line 666.

The brick pusher 236 continues to rotate, due to actuation of both the air motors 238 and 60, until the limit switch [257] *261* is actuated, thus indicating occurrence of a predetermined amount of rotation which is sufficient to allow placement of the next brick in the lining 28. When this occurs, valve [257] *261* shifts to allow air in line 638 to pass to line 642 into chamber "B" of valve 628 to switch the valve to return the brick pusher 236 to its return position. The air in chamber "A" is exhausted through vent line 601 of valve 306, the valve 306 being in its unactuated state since the gripper arms on the brick gripper 264 have returned to their return position. When the brick pusher valve 628 changes positions upon air entering chamber "B," the air in line 634, and thus in line 644, is released to the atmosphere to the vent line 629. The valve 654 then returns to its neutral position due to the spring bias and also due to momentarily air being sent to chamber "B" by pilot line 646.

During operation of the brick gripper 264 and the operation of the brick pusher 236, the conveyor indexing mechanism 192 has been actuated (due to release of valve 346 when the brick gripper 264 picked up the brick 144) to deliver the next to be laid brick along the conveyor chains 166, thus actuating the valve 346 and sending air from line 526 to line 556. When the brick pusher 236 returns, valve [261] *257* will be actuated and air will be delivered from line 556 to line 564 and another brick will be laid in place in the manner described above.

When initially orienting the conveyor assembly 146 relative to the circumference of the ladle 22, it may be necessary to actuate air motor 60 in order to turn the conveyor assembly. This is accomplished by placing the main control valve 408 in the "manual" position and using push button valves 648 and 656. If the air motor 60 is to be operated to turn the turntable 30 clockwise, valve 648 is continually depressed to deliver air from lines 680, 676 to chamber "A" of valve 654. The operation for counterclockwise rotation of the turntable 34 is accomplished by actuation of valve 656 in a similar manner to that done for clockwise rotation. Check valves 682 and 684 are provided in lines 546 and [415] *412* respectively so that air will not be fed into the manual line during automatic operation or fed into the automatic line during manual operation.

From the foregoing it is apparent that there is herein provided an automated bricklaying device 20 which permits the rapid buildup of the spiraling courses of refractory brick 144 necessary to form the working lining 28 of a metal pouring ladle 22. The shell of the ladle 22 provides a circumferential guidance while the spiraling brick courses themselves provide the necessary height guidance so that the bricks are properly placed to form the working lining 28. A conveyor indexing mechanism to the front of a conveyor assembly 146 wherein a brick gripper mechanism 264 grasps the bricks one at a time and lays them in the lining 28 of the ladle 22. A brick pusher mechanism 236 and a conveyor extension wheel 208 attached to the front of the conveyor assembly 146 serves to firmly secure and set each brick against the previously laid brick and causes actuation of a turntable motor 60 to index the device 20 to the proper position for laying the next brick in the lining. During operation of the pushing cycle and indexing cycle, if it is desirous mortar may be provided to be placed in the working lining so as to ensure a proper seating and holding of the bricks within the ladle.

It will be understood that various changes in the details, materials and arrangements of parts which have been herein described and illustrated in order to explain the matter of the invention may be made by those skilled in the art within the principle and scope of the invention as expressed in the appended claims.

What is claimed is:

1. An automated bricklaying device for laying out the brick lining of a vessel, the device comprising:

a delivery means for delivering a series of bricks in turn to the circumference of the vessel to be set as the lining thereof;

a brick positioning means associated with said delivery means for *both circumferentially and laterally* positioning and firmly setting each brick in turn in the lining as it is delivered to the circumference of the vessel;

a supporting means for supporting said delivery means and said brick positioning means inside the vessel and for permitting, of said delivery means and said brick positioning means, longitudinal movement along, reciprocal lateral movement relative to and revolutional movement about an axis thereof positioned within and substantially parallel to the axis of the vessel to be lined;

an operating means for moving said delivery means and said brick positioning means longitudinally along, laterally relative to and revolutionally about said axis of said support means so as to position said delivery means and said brick positioning means relative to the circumference of the vessel; and

[a] *automatic* control means for controllably operating said operating means [after a brick has been positioned in place in the lining for properly positioning said delivery means and said brick positioning means] *including means for stopping said operating means when said delivery means and said brick positioning means are properly positioned* for the placement of the next succeeding brick in the lining, *said means being responsive to the position of the lastly laid brick in the lining.*

2. The apparatus of claim 1 wherein said support means includes an upright frame assembly mounted within the ladle, and a platform assembly carried by said upright frame assembly for longitudinal movement therealong, said delivery means being mounted to said platform assembly for reciprocal lateral movement relative thereto.

3. The apparatus of claim 2 wherein said support means further includes a turntable placed in the bottom of the vessel, said turntable comprising a lower platen and an upper platen supported by said lower platen for rotational movement relative thereto, the axis of rotation being said axis of said support means, and wherein said upright frame assembly is mounted to said upper platen whereby, when said upper platen rotates relative to said lower platen, said delivery means revolves about said axis of rotation.

4. The apparatus of claim 3 wherein said operating means includes a hoist means for selectively raising and lowering said platform assembly along said upright frame assembly and a reciprocating drive means for selectively extending and retracting said delivery means relative to said platform assembly.

5. The apparatus of claim 4 wherein said operating means further includes a rotary actuating means for imparting rotary movement to said upper platen of said turntable relative to said lower platen.

6. The apparatus of claim 5 wherein said *automatic* control means includes a first limit switch means for causing operation of said rotary actuating means and *wherein said means of said automatic control means for stopping said operating means is* a second limit switch means for stopping operation of said rotary actuating means, said second switch means being actuated to stop said rotary actuating means after said brick positioning means has moved a predetermined distance relative to the circumference of the vessel.

7. The apparatus of claim 6 wherein said first limit switch means is actuated to cause operation of said rotary actuating means after said placement means has placed a brick in the lining.

8. The apparatus of claim 4 wherein said control means includes a vertical guidance means on said platform assembly, said vertical guidance means causing actuation of said hoist means so as to maintain a fixed vertical relation between said platform assembly and the built up lining.

9. The apparatus of claim 4 wherein said control means includes an extension guidance means on said delivery means, said extension guidance means actuating said reciprocating drive means so as to maintain a fixed relation between said delivery means and the built up lining.

10. The apparatus of claim 1 wherein said delivery means is a conveyor means having a conveyor indexing means for selectively advancing the bricks on said conveyor means to the circumference of the vessel.

11. The apparatus of claim 10 wherein said delivery means includes a placement means for taking a brick from said conveyor means and placing it in the circumference of the vessel.

12. The apparatus of claim 1 wherein said brick positioning means comprises a first means for pushing a brick delivered to the circumference of the vessel into engagement with the previously laid brick and a second means for pushing a brick delivered to the circumference of the vessel into engagement with the interior wall of the vessel.

13. An automated bricklaying machine for laying out the refractory brick lining of a metal pouring ladle, the machine comprising:

an upright means extending into the ladle;

a mounting means for supporting said upright means for traversing about the circumference of the ladle;

a platform means carried by said upright means for vertical movement therealong;

means for selectively raising and lowering said platform means relative to said upright means;

a delivery means on said platform means reciprocally laterally movable relative thereto for delivering a series of refractory bricks in turn to the circumference of the ladle to be set as the lining thereof;

a positioning and indexing means on said delivery means for properly positioning each brick in turn in the lining while indexing said platform means to a proper position for placement of the next succeeding brick in the lining; and vertical guidance means on said [conveyor] *delivery* means for providing vertical elevational control of said platform means relative to the built up lining.

14. The apparatus of claim 13 wherein said mounting means is a turntable placed on the bottom of the ladle, said turntable comprising a lower platen and an upper platen supported by said [,] lower platen for rotational movement relative thereto.

15. The apparatus of claim 14 wherein said upper platen is supported by means of a plurality of rollers journaled on the side of said lower platen and wherein said lower platen has a plurality of leveling screws for leveling said lower platen.

16. The apparatus of claim 15 wherein said turntable includes a gear ring mounted to said lower platen; a pinion gear having a shaft journaled in said upper platen and having teeth engaging teeth of said gear ring; a sprocket means fixed to said shaft of said pinion gear; a rotary actuating motor mounted to said upper platen; and a chain means for said sprocket means and said rotary actuating motor whereby, when said rotary actuating motor is actuated, said upper platen is rotated relative to said lower platen.

17. The apparatus of claim 16 wherein said positioning and indexing means includes a second means for pushing a brick in the lining into engagement with the previously laid brick in the built up lining.

18. The apparatus of claim 17 wherein said second means is a brick pusher having a rotary actuating means; a wheel means; a linkage means connected at one end to said rotary actuating means and connected at the other end to said wheel means such that upon actuation of said rotary actuating means said wheel means follows a fixed path to push brick in the lining into engagement with the previously laid brick.

19. The apparatus of claim 18 wherein there is a control system associated with said brick pusher and said rotary actuating motor on said turntable for actuating said rotary actuating motor on said turntable when said rotary [actuator] *actuating means* of said brick pusher is actuated.

20. The apparatus of claim 19 wherein said brick pusher includes a limit switch means which, when actuated, stops said brick pusher from pushing and indicates that said platform means is in a proper position for placement of the next succeeding brick in the lining.

21. The apparatus of claim 13 wherein said delivery means includes a conveyor means for advancing bricks thereon toward the circumference of the ladle and a placement means for taking bricks in said conveyor means one at a time and placing them in turn in the lining.

22. The apparatus of claim 21 wherein said delivery means further includes a conveyor indexing means having a one-way friction clutch and a reciprocating drive means whereby said conveyor means is advanced when said one-way friction clutch is driven in a first direction by said reciprocating drive means and said conveyor means remains stationary when said one-way friction clutch is driven in a second direction by said reciprocating drive means.

23. The apparatus of claim 21 wherein said placement means is a brick gripper for transferring a brick in a first position on said conveyor means to a second position in the lining.

24. The apparatus of claim 13 wherein said positioning and indexing means includes a first brick pushing means for laterally pushing a brick in the lining into engagement with the interior wall of the ladle.

25. The apparatus of claim 24 wherein said lateral brick pushing means is an exterior wheel positioned on said delivery means.

26. The apparatus of claim 13 wherein said means for selectively raising and lowering said platform means is a hoist motor positioned on said upright means.

27. The apparatus of claim 26 wherein said vertical guidance means is a wheel means carried by said delivery means which rides on the top of the built up lining, said wheel means actuating said hoist means on said upright means for maintaining a fixed vertical relation between said platform means and the built up lining.

28. The apparatus of claim 13 wherein said platform means includes a means for picking up bricks resting on said platform means and placing them on said delivery means.

29. In a bricklaying machine for lining a ladle with bricks having a conveyor means, a placement means having a pickup position and a placement position, a brick positioning means having a return position and a pushing position, and an apparatus positioning means, a control system for controllably operating the machine to perform a series of sequential operations comprising, in combination:

a first means for operating the conveyor means to deliver the bricks to the placement means;

a second means for operating the placement means to place the bricks in the lining of the ladle;

a third means for operating the brick positioning means to properly position the bricks in the lining;

a fourth means for operating the apparatus positioning means to index the conveyor means, the placement means and the brick positioning means relative to the circumference of the ladle;

a first switch means for controlling said first means such that when said first switch means is actuated, said first means is operable to cause said conveyor means to stop, said first switch means being actuable whenever a brick on said conveyor means is in position for removal therefrom by said placement means;

a second switch means for controlling said second means such that when said second switch means is actuated, said second means is operable to cause said placement means to pick up a brick from said conveyor means and move said brick toward said ladle lining, said second switch means being actuable whenever said first switch means is actuated and said brick positioning means is in a return position;

a third switch means for controlling said second means, said third means and said fourth means such that when said third switch means is actuated, the following operations take place:

a. said second means is operable to cause said placement means to stop, to release the brick held thereby, and to return to its pickup position, b. said third means is operable to cause said brick positioning means to move towards said pushing position to properly position said brick released by said placement means in said ladle lining, and c. said fourth means is operable to cause said apparatus positioning means to move said conveyor means, said placement means and said brick positioning means relative to said circumference of said ladle, said third switch means *being* actuable when said placement means is in the placement position to place said brick in said lining; and a fourth switch means for controlling said third means and said fourth means such that when said fourth switch means is actuated the following operations take place:

a. said third means is operable to return said brick positioning means to its return position, and b. said fourth means is operable to cause said apparatus positioning means to stop, said fourth switch means being actuable when said apparatus positioning means has indexed said conveyor means, said placement means and said brick positioning means to a proper position for placement of the next succeeding brick in the lining.

30. The apparatus of claim 29 wherein said first means is a conveyor indexing means including a one-way friction clutch for driving said conveyor means in one direction only.

31. The apparatus of claim 30 wherein said conveyor indexing means includes a reciprocal drive motor having an advancing motion and a retraction motion, said reciprocal drive motor being controlled by two limit switch means for causing advancing motion and for causing retraction motion.

32. The apparatus of claim 29 wherein there is a fifth means for operating said placement means to place bricks in the lining in one of two different orientations and wherein there is a fifth limit switch means for controlling said fifth means.

33. The apparatus of claim 29 wherein said fourth means includes a vertical drive means, a lateral drive means and a rotational drive means [whereby] *and wherein* said third and fourth limit switch means [controlling] *control* operation of said rotational drive means, said vertical drive means and said lateral drive means [being controlled so as] to maintain a fixed vertical and lateral relation between [said] *the* conveyor means *and the circumference of the ladle* as said rotational drive means rotates the conveyor means, the placement means and the brick positioning means.

34. The apparatus of claim 29 wherein said control system is a pneumatic control system and wherein said first, second, third and fourth means are pneumatic operating means and said first, second, third and fourth limit switch means are pneumatic limit switches.

(References on following page)

References Cited

The following references, cited by the Examiner, are of record in the patented file of this patent or the original patent.

UNITED STATES PATENTS

| | | | |
|---|---|---|---|
| 3,039,233 | 6/1962 | Holmes | 52—749 |
| 3,177,621 | 4/1965 | Demarest | 52—749 |
| 3,287,875 | 11/1966 | Lakin | 52—749 X |
| 3,439,794 | 4/1969 | Park et al. | 52—749 X |

| | | | |
|---|---|---|---|
| 3,550,344 | 12/1970 | Maier et al. | 52—749 |
| 3,646,722 | 3/1972 | Salmi | 52—749 X |

FOREIGN PATENTS

| | | | |
|---|---|---|---|
| 72,741 | 4/1951 | Denmark | 52—749 |

PRICE C. FAW, Jr., Primary Examiner

U.S. Cl. X.R.

52—747

UNITED STATES PATENT OFFICE

CERTIFICATE OF CORRECTION

PATENT NO. : Re.28,305

DATED : January 21, 1975

INVENTOR(S) : Ronald E. Williamson, et al

It is certified that error appears in the above-identified patent and that said Letters Patent are hereby corrected as shown below:

| | |
|---|---|
| Column 1, line 9 | Ser. No. 466,566 should read Ser. No. 466,565 |
| Column 1, line 24 | delete "theeon" and insert --thereon--. |
| Column 6, line 23 | delete "154" and insert --254--. |
| Column 10, line 18 | delete "delievered" and insert --delivered--. |
| Column 10, line 42 | delete "delievered" and insert --delivered--. |
| Column 10, line 72 | delete "throuhg" and insert --through--. |
| Column 12, line 28 | delete "532" and insert --531--. |
| Column 14, line 51 | following "mechanism" insert --178 operates to deliver a series of refractory bricks 144--. |

Signed and Sealed this

*eighteenth* Day of *May 1976*

[SEAL]

*Attest:*

RUTH C. MASON
*Attesting Officer*

C. MARSHALL DANN
*Commissioner of Patents and Trademarks*